United States Patent [19]
Guo

[11] Patent Number: 5,684,410
[45] Date of Patent: Nov. 4, 1997

US005684410A

[54] PRECONDITIONING OF OUTPUT BUFFERS

[76] Inventor: Frank Tzen-Wen Guo, 20 Glenhill Ct., Danville, Calif. 94526

[21] Appl. No.: 497,794

[22] Filed: Jul. 3, 1995

[51] Int. Cl.[6] ..................... H03K 19/0948; H03K 17/16
[52] U.S. Cl. ................................................ 326/27; 326/83
[58] Field of Search ............................. 326/26, 27, 83, 326/86, 121

[56] References Cited

U.S. PATENT DOCUMENTS

| | | | |
|---|---|---|---|
| 4,983,860 | 1/1991 | Yim et al. | 326/86 |
| 4,988,888 | 1/1991 | Hirose et al. | 326/86 |
| 5,045,722 | 9/1991 | Yang et al. | 326/83 |
| 5,057,711 | 10/1991 | Lee et al. | 326/27 |
| 5,151,621 | 9/1992 | Goto | 326/121 |
| 5,179,300 | 1/1993 | Rolandi et al. | 326/83 |
| 5,381,055 | 1/1995 | Lai et al. | 326/27 |
| 5,420,525 | 5/1995 | Maloberti et al. | 326/27 |
| 5,450,019 | 9/1995 | McClure et al. | 326/27 |
| 5,461,330 | 10/1995 | Gist et al. | 326/86 |

*Primary Examiner*—Edward P. Westin
*Assistant Examiner*—Benjamin D. Driscoll
*Attorney, Agent, or Firm*—Davis Chin

[57] ABSTRACT

An output buffer circuit for preconditioning an output signal at an output node so as to provide a higher speed of operation and less ground bounce noise includes an output buffer stage, a precondition feedback circuit, an output predriver, an output tristate control circuit, and an output state retention circuit. The output pre-driver with input equalization, which is also part of precondition control, combined with the output buffer stage designed with its threshold voltage matching component's input and output threshold voltage such that the output feedback, which bring the output and the input nodes of the output buffer stage together, will drive the output level to the threshold point enabled by the precondition signals before the data input signals arrive. The output buffer noise can be reduced by slowly driving output level to the output threshold point about three to four nanoseconds earlier than the data input signals arrive. The output state retention circuit is provided to help in minimizing the output glitch which occurs during output high-to-high or output low-to-low transition.

19 Claims, 4 Drawing Sheets

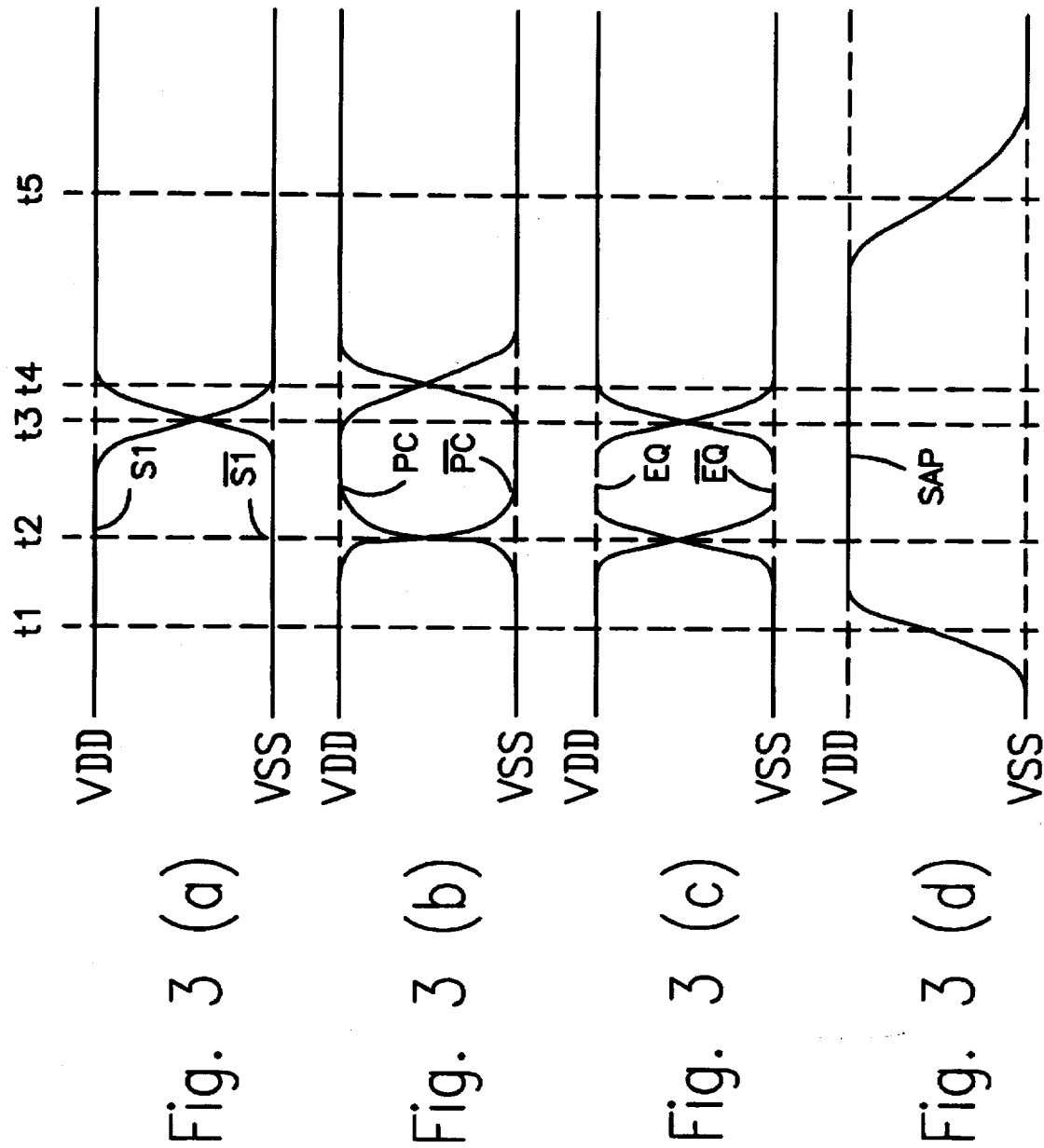

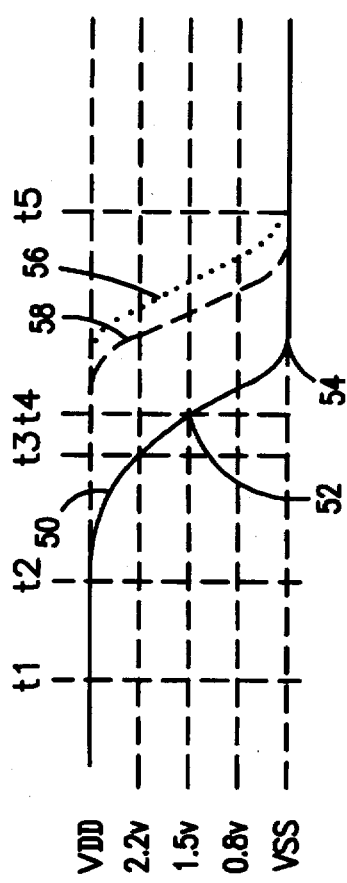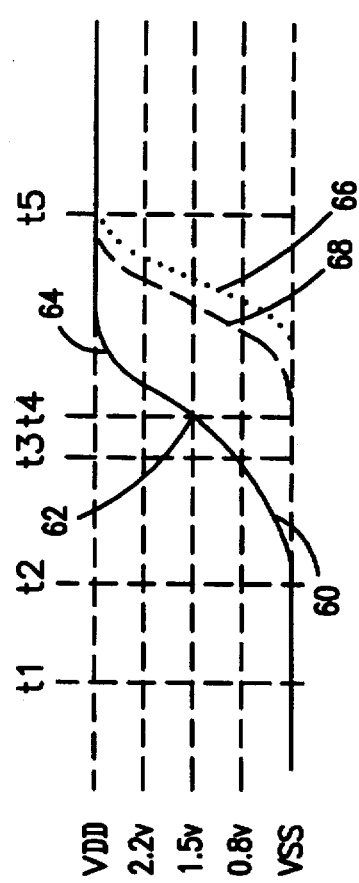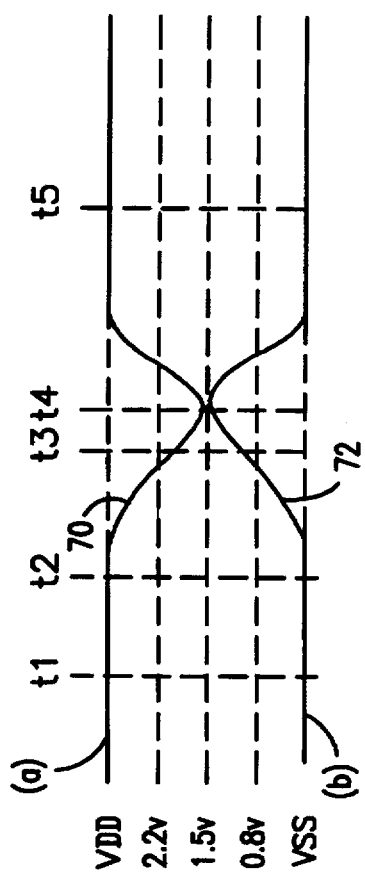

PRECONDITIONING OF OUTPUT BUFFERS

BACKGROUND OF THE INVENTION

This invention relates generally to high-speed, high-drive output buffer circuits and more particularly, it relates to output buffer circuits which include means for preconditioning an output signal at an output node so as to improve its speed of operation, and also to reduce the ground bounce noise at the same time.

As is well-known in the art, digital logic circuits are widely used in the areas of electronics and computer-type equipment. Specifically, one such use of digital logic circuits is to provide an interface function between integrated circuit devices. An output buffer circuit is an important component for this interface function. The output buffer circuit provides, when enabled, an output signal which is a function of a data input signal received from other logic circuitry of the integrated circuit.

A typical output buffer circuit includes a pull-up transistor device and a pull-down transistor device connected in series between respective first and second power supply terminals. The first power supply terminal may be supplied with a positive potential or voltage VCC, which is about +3.3 volts or lower in low voltage logic integrated circuits, and is typically at +3.0 volts. The second power supply terminal may be supplied with a ground potential VSS, which is typically at zero volts. The drains of the pull-up and pull-down transistor devices are connected together, which is connected to an output node. The gates of the pull-up and pull-down transistor devices are joined to internal nodes for receiving data input signals.

Dependent upon the logic state of the data input signal and the enable signal, either the pull-up transistor or the pull-down transistor is quickly turned on and the other one of them is turned off. Such rapid switching off and on of the pull-up and pull-down transistor devices causes sudden surge of current creating what is commonly known as current spikes. As a result, when the internal node is making a high-to-low transition, oscillations or inductive ringing appears at the output node referred to as "ground bounce noise." This is a major problem in high-speed output buffer circuits.

An output buffer is normally quite large in size since it usually provides a large drive current which is needed to meet the input requirements of another circuit that utilizes the output signal from the output buffer. It is always desirable to have faster switching times and reduced noise levels in high-speed digital circuits, especially when the digital circuits are formed as a semiconductor integrated circuit with a high density of components. As the integrated circuits are made smaller and faster, the propagation delay through the output buffer becomes an important factor in the overall delay in the digital circuits.

Generally, the faster that a signal is switched and the greater the current that is changed, the greater will be the noise generated by the output buffers. This increased noise can interfere with the functioning of the other circuit components which interface with the output buffers. This trend towards high density for the components on the integrated circuit chip make noise reduction or suppression especially important in output buffer designs. In particular, the magnitude of the ground bounce noise is larger when the voltage switching range is larger or when the output current of the output buffer is larger. Since a ground line is shared by many devices on the integrated circuit chip, the ground bounce noise, if large enough, may degrade the output voltage level (logic "1" and logic "0") causing interface problems among the output buffer circuit and other integrated circuits. The problem of ground bounce noise is even more magnified when several output buffers are operated with a common ground line.

Various approaches have been attempted heretofore in output buffer design for minimizing the undesired ground bounce noise. Since a conventional output buffer is responsive to input signals and amplifies them in order to produce the output signal, the output signal begins to make the transition to the desired logic state only after the input signals arrive at its input. Therefore, one known technique for controlling the output noise level is to control the output slew rate or the rate at which the output signal transitions from a first voltage level to a second voltage level. However, this method has a serious disadvantage in that the high-speed of operation of the output buffer is significantly reduced and thus its output delay is increased.

A second known technique for controlling better the output noise level is to form the output buffer with a number of stages which are sequentially turned on. For example, in an output buffer formed of three stages, the first stage receives the input signals and amplifies them to drive the output without any delay. The second stage is delayed in its turn-on time relative to the first stage to drive the output. Further, the third stage is delayed in its turn-on time relative to the second stage to drive the output. While this method provides better control of the output noise level with less propagation delay, it still suffers from a drawback in that the speed of operation is relatively slow due to smaller size in the first stage of the output buffer and because its output transition does not begin from the first or second power supply potential until after the input signals arrive.

The output buffer of the present invention represents a significant improvement over the above-described prior art buffer circuits so as to produce a higher speed of operation and meanwhile to reduce the ground bounce noise. This is achieved by the provision of means for preconditioning the output signal at an output node by early driving the output signal slowly to a threshold point prior to the arrival of the actual input signals for the output buffer.

SUMMARY OF THE INVENTION

Accordingly, it is a general object of the present invention to provide an improved output buffer with a higher speed of operation and less ground bounce noise which is relatively simple and economical to manufacture and assemble, and which overcomes the disadvantages of the prior art output buffer circuits.

It is an object of the present invention to provide an improved output buffer circuit which has a significant reduction in propagation delay.

It is another object of the present invention to provide an improved output buffer circuit which includes means for preconditioning an output signal at an output node so as to improve its performance and meanwhile to reduce the ground bounce noise.

It is still another object of the present invention to provide an improved output buffer circuit which includes means for preconditioning the output signal at an output node by early driving the output signal slowly to a threshold point prior to the arrival of the actual input signals for the output buffer.

In accordance with these aims and objectives, the present invention is concerned with the provision of an improved output buffer circuit for preconditioning an output signal at an output node so as to provide a higher speed of operation and less ground bounce noise which includes an output buffer stage formed of a pull-up transistor and a pull-down transistor. The pull-up transistor has one of its main electrodes connected to a power supply potential and its other one of its electrodes connected to the output node. The pull-down transistor has one of its main electrodes connected to the output node and its other one of its electrodes connected to a ground potential. The output node is initially disposed at either a high logic level or a low logic level. A predriver circuit is responsive to equalization signals for generating an output predriver signal at its output line which is at a threshold point substantially intermediate the power supply potential and the ground potential. A feedback circuit is interconnected between the output node and the gate electrodes of the pull-up transistor and the pull-down transistor and is responsive to precondition signals for connecting the output line of the predriver circuit to the output node so as to drive the output node to the threshold point. The size ratio of the pull-up transistor to the pull-down transistor is designed to have an input threshold point the same as the output threshold voltage, which is the transition level between an output high and an output low.

The predriver circuit is further responsive to data input signals for causing the output predriver signal to move either to the power supply potential or to the ground potential. The gate electrode of the pull-up transistor is responsive to the output predriver signal and moves to the power supply potential when the output node is initially at the high logic level for generating a transition from the threshold point to the low logic level. The gate electrode of the pull-down transistor is responsive to the output predriver signal and moves to the ground potential when the output node is initially at the low logic level for generating a transition from the threshold point to the high logic level.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIGS. 3(a)–3(d) are waveforms of the respective actual data input signals, the precondition signals, the equalization signals, and the power control signal for the predriver circuit of FIG. 2;

FIG. 4 is a graph of the output signal in the output buffer circuit of FIG. 2 during a high-to-low transition;

FIG. 5 is a graph of the output signal in the output buffer circuit of FIG. 2 during a low-to-high transition; and FIG. 6 are waveforms of the output signal in the output buffer circuit of FIG. 2 during a high-to-high transition and during a low-to-low transition, respectively.

DESCRIPTION OF THE PREFERRED EMBODIMENT

Figure 1:
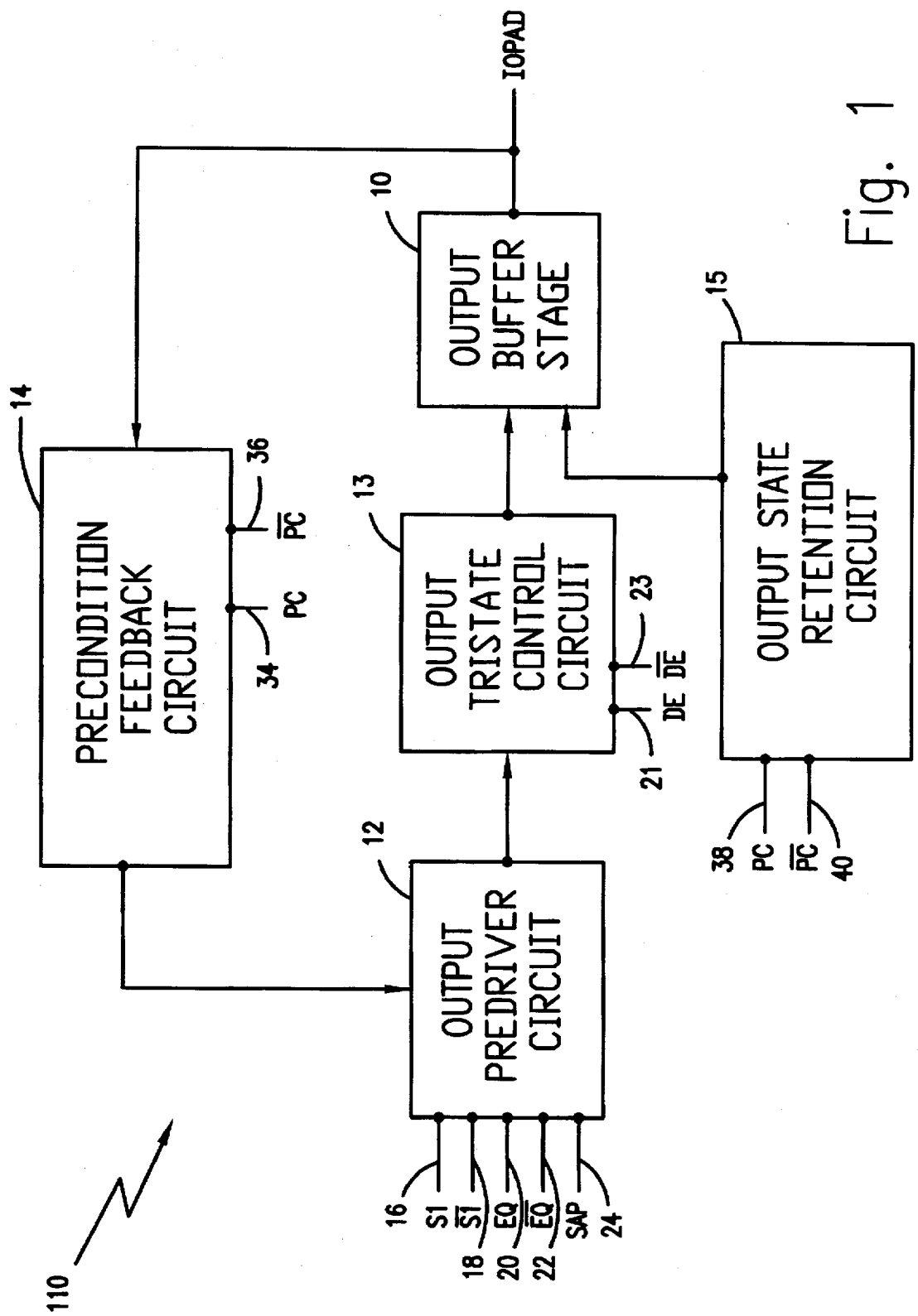
FIG. 1 is a simplified block diagram of an output buffer circuit, constructed in accordance with the principles of the present invention.

Referring now in detail to the drawings, there is shown in FIG. 1 a simplified block diagram of an improved output buffer circuit 110 which is constructed in accordance with the principles of the present invention. The output buffer circuit 110 provides the capability of preconditioning the output signal at an output node by early driving the output signal slowly to a threshold point prior to the arrival of the actual data input signals for the output buffer. This is achieved by the use of precondition signals which can be generated in a number of ways such as from either a clock signal in synchronous components, or address transition detection signals in memory components, or any other signals which can be obtained earlier than the actual data input signals.

Preferably, these precondition signals are generated approximately 3 to 4 nanoseconds prior to the arrival of the actual data input signals for the output buffer. Since the output signal is being slowly driven to the threshold point, then the ground bounce noise can be efficiently and effectively controlled. With the output signal at the output node being preconditioned at the threshold point, the output signal can then be triggered into the desired logic state with minimum propagation delay. As a result, the output buffer circuit of the present invention can be operated with a higher speed of operation and less ground bounce noise.

The output buffer circuit 110 includes an output buffer stage 10, a predriver circuit 12, a tri-state control circuit 13, a precondition feedback circuit 14, and an output state retention circuit 15. As can be seen from the detailed schematic circuit diagram of FIG. 2, the output buffer stage 10 is formed of a large P-channel MOS pull-up transistor Pd and a large N-channel MOS pull-down transistor Nd. The pull-up transistor Pd has its source connected to a positive supply potential or voltage VDD, which is about +3.3 volts or lower in low voltage logic integrated circuits, and is typically at +3.0 volts or lower. The pull-down transistor Nd has its source connected to a ground potential VSS, which is typically at 0 volts. The drains of the transistors Pd and Nd are connected together at an internal node A which is coupled to an output node IOPAD.

The predriver circuit 12 receives data input or differential sense signals S1 and $\overline{S1}$ on respective input terminals 16 and 18, equalization signals EQ and $\overline{EQ}$ on respective input terminals 20 and 22, and a power control signal SAP on input terminal 24 and generates an output predriver signal PS on line 26 defining the output of the predriver circuit. The predriver circuit 12 includes a first P-channel drive transistor P2 and a second P-channel drive transistor P3. The drive transistor P2 has its source connected to the supply potential VDD and its gate connected to receive the sense signal $\overline{S1}$. The drive transistor P3 has its source also connected to the supply potential VDD and its drain connected to the line 26. The gate of the transistor P3 is connected to receive the sense signal S1.

A first N-channel load transistor N2 has its drain connected to the drain of the transistor P2 and its source connected to the ground potential VSS. A second N-channel load transistor N3 has its drain connected to the drain of the transistor P3 and the line 26 and its source connected to the ground potential. The drive transistors P2, P3 and the load transistors N2, N3 are connected together so as to form a current mirror arrangement.

The predriver circuit 12 also includes an N-channel power control transistor N4, a first leaker transistor N5, and a second leaker transistor N6. The control transistor N4 has its drain connected to the drain of the transistor N2 and its source connected to the gate of the transistor N2. The gate of the transistor N4 is connected to receive the power control signal SAP. The leaker transistor N5 has its drain connected to the gate of the transistor N2 and its source connected to the ground potential. The second leaker transistor N6 has its drain connected to the drains of the transistors P2 and N2 and to the gate of the transistor N3. The source of the transistor N6 is connected also to the ground potential. The gates of the transistors N5 and N6 are connected together and to the supply potential VDD.

A first CMOS transmission gate is formed by a P-channel MOS transistor PQ1 and an N-channel MOS transistor NQ1. The conduction paths of the transistors PQ1 and NQ1 are joined between the input terminals 16 and 18. The gate of the transistor NQ1 is connected to receive the equalization signal EQ, and the gate of the transistor PQ1 is connected to receive the complementary equalization signal $\overline{EQ}$. The N-channel MOS transistor NQ1 may be omitted without significantly affecting the equalization function.

The tri-state control circuit 13 receives enable signals DE and $\overline{DE}$ on respective input terminals 21, 23 for switching the output buffer stage 10 between a high impedance state (inactive) or an active state. The control circuit 13 includes a second CMOS transmission gate TG2, a first switching transistor P4, a third CMOS transmission gate TG3, and a second switching transistor N9. The second transmission gate TG2 is formed of a P-channel MOS transistor P5 and an N-channel MOS transistor N7, and the third transmission gate TG3 is formed of P-channel MOS transistor P6 and an N-channel MOS transistor N8.

When the enable signal DE is at a low logic level and the complementary enable signal $\overline{DE}$ is at a high logic level, the transmission gates TG2 and TG3 are both turned off and the transistors P4 and N9 are both turned on so as to turn off the respective pull-up transistor Pd and the pull-down transistor Nd of the output buffer stage 10. Thus, the output node IOPAD will be in the high impedance state. On the other hand, when the enable signal DE is at the high logic level and the complementary enable signal $\overline{DE}$ is at the low logic level, the transmission gates TG2 and TG3 will be both turned on and the transistors P4 and N9 will be turned off. As a result, the output predriver signal PS on the line 26 will be passed to the gate of the pull-up transistor Pd on line 28 and to the gate of the pull-down transistor Nd on line 30.

The precondition feedback circuit 14 is comprised of two series-connected CMOS transmission gates TG4 and TG5 interconnected between the output node IOPAD and the line 26 from the output of the predriver circuit 12. The transmission gate TG4 is formed of a P-channel MOS transistor P7 and an N-channel MOS transistor N10 whose sources are connected to the line 26 and whose drains are connected to the line 32. The gate of the transistor N10 is connected to an input terminal 34 for receiving a pre-condition signal PC, and the gate of the transistor P7 is connected to an input terminal 36 for receiving a complementary precondition signal $\overline{PC}$. The transmission gate TG5 is formed of a P-channel MOS transistor P8 and an N-channel MOS transistor N11 whose sources are connected to the line 32 and whose drains are coupled to the output node IOPAD via the internal node A. The gate of the transistor N11 is coupled to the input terminal 21 for receiving the enable signal DE, and the gate of the transistor P8 is coupled to the terminal 23 for receiving the complementary enable signal $\overline{DE}$. The transmission gate TG5 is disabled or turned off by the enable signals when the output stage 10 is in the high impedance state.

The output state retention circuit receives the precondition signals PC and $\overline{PC}$ on its respective input terminals 38 and 40, and receives the output predriver signal PS from the line 26 on its input line 42. The retention circuit 15 provides a first retention signal on line 44 which is coupled to the gate of the pull-up transistor Pd and a second retention signal on line 46 which is coupled to the gate of the pull-down transistor Nd. The retention circuit serves to retain the previous state of the output buffer stage 10 until the arrival of the actual data input signals.

The retention circuit 15 includes a sixth CMOS transmission gate TG6, a latch 47, and four pass transistors P12, P13, N15, and N16. The transmission gate TG6 is formed of a P-channel MOS transistor P11 and an N-channel MOS transistor N14 whose sources are connected to the line 26 from the predriver circuit 12 and whose drains are connected to a node B defining the input of the latch 47. The gate of the transistor P11 is connected to the input terminal 38 for receiving the precondition signal PC, and the gate of the transistor N14 is connected to the input terminal 40 for receiving the complementary precondition signal $\overline{PC}$. When the precondition signal PC is high and the complementary precondition signal $\overline{PC}$ is low, the transmission gate TG6 is turned off (precondition is enabled). When the precondition signal PC is low and the complementary precondition signal $\overline{PC}$ is high, the transmission gate TG6 is turned on (precondition is disabled).

The latch 47 is formed of two inverters I1 and I2. The inverter I1 is formed by a P-channel MOS transistor P10 and an N-channel MOS transistor N13 whose gates are connected together and to the node B and whose drains are connected together and to a node C defining the output of the latch. The inverter I2 is formed by a P-channel MOS transistor P9 and an N-channel MOS transistor N12 whose gates are connected together and to the node C and whose drains are connected together and to the node B. The sources of the transistors P10 and P9 are connected to the supply potential VDD, and the sources of the transistors N13 and N12 are connected the ground potential.

The pass transistor P12 has its source connected to the supply potential VDD and its drain connected to the source of the pass transistor P13. The drain of the transistor P13 is connected to the line 44. The gate of the transistor P12 is connected to the output of the latch at the node C, and the gate of the transistor P13 is connected to the terminal 40 for receiving the complementary precondition signal $\overline{PC}$. The pass transistor N15 has its drain connected to the drain of the transistor N16. The source of the transistor N16 is connected to the line 46. The gate of the transistor N15 is also connected to the node C, and the gate of the transistor N16 is connected to the terminal 38 for receiving the precondition signal PC.

When the precondition is disabled, the transistors P13 and N16 are rendered non-conductive and thus the retention circuit is also disabled. However, since the transmission gate TG6 will be on at this time the output predriver signal PS on the line 26 is passed into the latch 47 and stored therein. When the precondition is enabled, the transmission gate TG6 will be turned off and the transistors P13 and P16 will be both turned on and the previously stored signal in the latch will be passed through either the series transistors P12 and P13 or the series transistors N15 and N16. If the previously stored signal was at a low logic level, then it will be passed to the gate of the pull-up transistor Pd via the transistors P12 and P13 and the line 44. If the previously stored signal was at a high logic level, then it will be passed to the gate of the pull-down transistor Nd through the transistors N15 and N16 and the line 46.

FIG. 3(a) shows the waveform of the data input or differential sense signal S1 and $\overline{S1}$ which are from sense amplifiers (not shown) and are the actual input signals for the output buffer circuit. It can be seen that these sense signals occur at time t3. FIG. 3(b) shows the waveforms of precondition signals PC and $\overline{PC}$ which are generated at time t2, which is approximately 3 to 4 nanoseconds prior to the arrival of the input signals S1 and $\overline{S1}$ at the time t3. The equalization signals EQ and $\overline{EQ}$ are shown in FIG. 3(c) which are also enabled at the time t2 and are disabled at the time t3. The power control signal SAP is illustrated in FIG. 3(d) and is generated at time t1 which is before the arrival of the input signals at the time t3. The time t1 is preferably made to occur before or about the same time as the precondition signals arrive at the time t2 so that the predriver circuit is fully powered up during the precondition and the signal amplification period. After the arrival of the input signals S1 and $\overline{S1}$ at the time t3, the equalization signals EQ and $\overline{EQ}$ are disabled so as to allow the input predriver to start amplifying the input signals.

It will be noted that after the arrival of the actual input signals S1 and $\overline{S1}$ at the time t3 the precondition signals PC and $\overline{PC}$ are also disabled at the time t4. Further, it can be seen that the power control signal goes low at time t5 after the actual input signals have been sent to the output buffer circuit. In this manner, the predriver circuit 12 is switched from a fully powered differential amplifier to a low powered amplifier in order to reduce power consumption.

Figure 2:
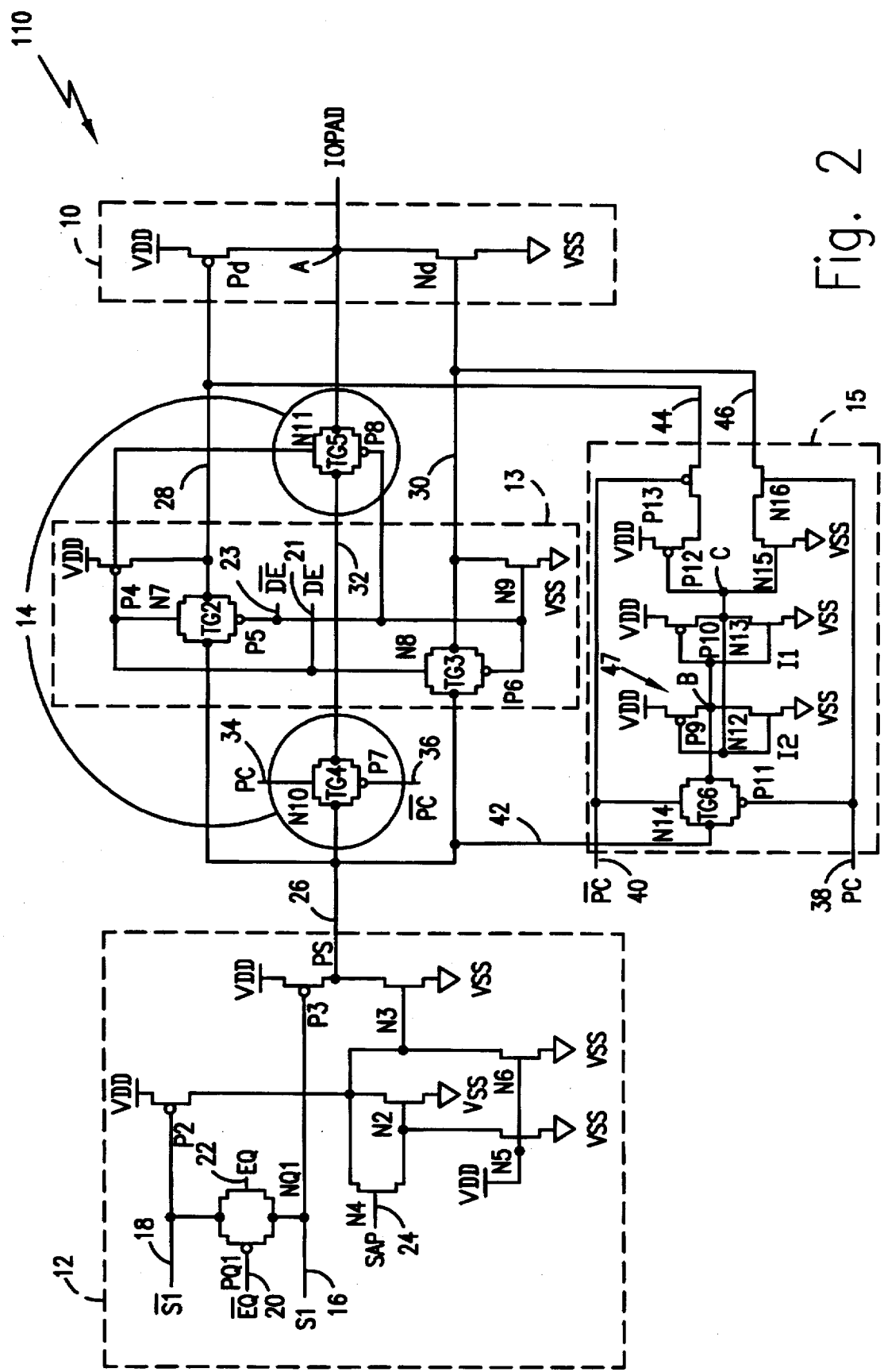
FIG. 2 is a schematic circuit diagram of the output buffer circuit of FIG. 1.

In order to provide an understanding of the operation of the output buffer circuit 110 of FIG. 2 of the present invention, the pull-down action will now be explained with reference to FIGS. 4 and 3(a)–3(d). Initially, it will be assumed that the output predriver signal PS on the line 26 is at a low or logic "0" level and that the enable signal DE is high and the complementary enable signal $\overline{DE}$ is low. Further, it will be assumed that the pull-up transistor Pd is turned on and that the pull-down transistor Nd is turned off so that the output node IOPAD will be at the high level.

When the equalization signals EQ and $\overline{EQ}$ and the power control signal SAP are enabled at the respective times t2 and t1 as shown in FIGS. 3(c) and 3(d), the predriver circuit 12 will be powered up and its inputs on the terminals 16 and 18 are equalized so as to cause the predriver signal PS on the line 26 to be driven and settle at about one-half of the supply potential VDD=+3.0 volts or +1.5 volts. When the precondition signals PC and $\overline{PC}$ are enabled at the time t2 as shown in FIG. 3(b), there will be a feedback path created between the output node IOPAD and the output of the predriver circuit at the line 26. As a result, the predriver signal PS will drive the output node towards the threshold level of +1.5 volts, which is conventionally the transition level between an output high and an output low. For TTL levels, the output high level is a voltage which is higher than +2.2 volts and the output low level is a voltage which is lower than +0.8 volts. As can be seen from the curve 50 of FIG. 4, the output level will move to point 52.

It should be noted that the transistors Pd and Nd of the output buffer stage 10 are also designed to have the threshold voltage of +1.5 volts. This threshold voltage is obtained by ratioing the size of the transistor Pd to the size of the transistor Nd. Thus, when the output node IOPAD is fed back to the input of the output buffer stage on the line 26 via the transmission gates TG5 and TG4, the output node and the line 26 are driven to settle at the threshold voltage of +1.5 volts. Consequently, the precondition signals PC and $\overline{PC}$ serve to not only lower the output slew rate, which will in turn reduce the ground bounce noise, but also will earlier drive the output node to the transition point and to then wait for the occurrence of the actual data input signals (differential sense signals S1 and $\overline{S1}$).

It should also be noted that, if the threshold voltage is not at +1.5 volts on the input threshold voltage of the logic device driven by the output buffer, the output buffer will be designed to have a threshold voltage which is the same as the input threshold voltage of the logic device to be driven by this output buffer. In this way the devices to be driven can receive the signal from the previous output buffer and respond with little delay.

Upon the arrival of the actual data input signals, the output of the predriver circuit and the output node will both already be preconditioned at the threshold point and will be switched to the low or logic "0" state at point 54 along the curve 50 in FIG. 4. It will also be noted that when the actual input data signals S1 and $\overline{S1}$ arrive at the time t3, as shown in FIGS. 3(a) and 3(b), the precondition signals PC and $\overline{PC}$ are simultaneously disabled. Therefore, the output signal at the output node IOPAD will then settle to the low state as soon as the data input signals S1 and $\overline{S1}$ arrive. By comparing the high-to-low transition curve 50 of the present invention to the dotted curve 56 for a conventional single stage buffer or to the dotted curve 58 for a conventional multiple stage buffer, it can be seen that the curve 50 makes a faster high-to-low transition with smaller amounts of delay.

In order to effect a pull-up action, it is assumed initially that the pull-up transistor Pd is turned off and that the pull-down transistor Nd is turned on so that the output node IOPAD will be at the low level. Similarly, the precondition signals PC and $\overline{PC}$ will cause both the output of the predriver circuit and the output node to be preconditioned again at the threshold point of +1.5 volts. As depicted in the curve 60 of FIG. 5, the output level will be moved to point 62. When the actual data input signal arrives, the output level will move to point 64 along the curve 60. The dotted curve 66 represents the low-to-high transition for the conventional single stage output buffer, and the dotted line 68 represents the low-to-high output transition for the conventional multiple stage output buffer. It can be likewise seen that the curve 60 makes a faster low-to-high transition with smaller amounts of delay.

When the output level makes a high-to-high transition or a low-to-low transition, the output level will move to the transition point first and then return back to the previous state. This may cause glitches to occur in the output node. The curve 70 in FIG. 6 shows the output level when a high-to-high transition is made. The curve 70 in FIG. 6 shows the output transition when a low-to-low transition is made. The output retention circuit 15 serves to reduce the output glitches by preventing the output node from crossing over to the opposite state.

From the foregoing detailed description, it can thus be seen that the present invention provides an improved output buffer circuit for preconditioning an output signal at an output node so as to provide a higher speed of operation and less ground bounce noise. The output buffer circuit of the present invention includes means for preconditioning the output signal at the output node by early driving the output signal slowly to a threshold point prior to the arrival of the actual input data signals for the output buffer.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. An output buffer circuit for preconditioning an output signal at an output node so as to provide a higher speed of operation and less ground bounce noise, comprising:

an output buffer stage formed of a pull-up transistor and a pull-down transistor, said pull-up transistor having one of its main electrodes connected to a power supply potential and its other one of its electrodes connected to the output node, said pull-down transistor having one of its main electrodes connected to the output node and its other one of its electrodes connected to a ground potential, said output node being initially disposed at either a high logic level or a low logic level;

predriver circuit means responsive to equalization signals for generating an output predriver signal at its output line which is at a threshold point substantially intermediate said power supply potential and said ground potential;

feedback means being interconnected between the output node and the gate electrodes of said pull-up transistor and pull-down transistor and being responsive to precondition signals for connecting the output line of said predriver circuit means to the output node so as to drive the output node to the threshold point;

said predriver circuit means being further responsive to data input signals for causing said output predriver signal to move either to said power supply potential or to said ground potential;

the gate electrode of said pull-up transistor being responsive to said output predriver signal so as to move to said power supply potential when the output node is initially at the high logic level for generating a transition from the threshold point to the low logic level; and the gate electrode of said pull-down transistor being responsive to said output predriver signal so as to move to said ground potential when the output node is initially at the low logic level for generating a transition from the threshold point to the high logic level.

2. An output buffer circuit as claimed in claim 1, wherein said pull-up transistor is a P-channel MOS transistor.

3. An output buffer circuit as claimed in claim 2, wherein said pull-down transistor is an N-channel MOS transistor.

4. An output buffer circuit as claimed in claim 3, wherein said feedback means is comprised of a CMOS transmission gate formed of a P-channel transistor and an N-channel transistor whose sources are connected together and whose drains are connected together, the gate of said P-channel transistor being connected to receive a true precondition signal, the gate of said N-channel transistor being connected to receive a complementary precondition signal.

5. An output buffer circuit as claimed in claim 4, wherein said precondition signals are generated earlier than said data input signals.

6. An output buffer circuit as claimed in claim 5, wherein said precondition signals are generated approximately 3 to 4 nanoseconds earlier than said data input signals.

7. An output buffer circuit as claimed in claim 6, wherein the ratio of the size of said P-channel transistor to the size of said N-channel transistor in said output stage is made to have a threshold voltage which is the same as the input threshold voltage of logic integrated devices driven by said output buffer, which is approximately +1.5 volts.

8. An output buffer circuit as claimed in claim 7, wherein said positive potential is about +3.3 volts or less and is typically at +3.0 volts and said ground potential is at zero volts.

9. An output buffer circuit as claimed in claim 1, wherein said predriver circuit is comprised of first and second drive transistors and first and second load transistors all connected to form a current mirror arrangement.

10. An output buffer circuit as claimed in claim 1, further comprising enabling means responsive to enable signals and connected to the gates of said P-channel and N-channel transistors for selectively switching the output buffer circuit between an active or low impedance state and an inactive or high impedance state.

11. An output buffer circuit as claimed in claim 1, further comprising retention circuit means responsive to said precondition signals and connected to the gates of said P-channel and N-channel transistors for preventing the logic level on said output node from crossing over to an opposite state.

12. An output buffer circuit as claimed in claim 1, wherein said predriver circuit means includes power control means for selectively switching between a fully powered condition and a low power condition.

13. An output buffer circuit for preconditioning an output signal at an output node so as to provide ahigher speed of operation and less ground bounce noise, comprising:

an output buffer stage formed of a pull-up transistor and a pull-down transistor, said pull-up transistor having one of its main electrodes connected to a power supply potential and its other one of its electrodes connected to the output node, said pull-down transistor having one of its main electrodes connected to the output node and its other one of its electrodes connected to a ground potential, said output node being initially disposed at either a high logic level or a low logic level;

means for early driving the output signal at the output node to a transition level so as to precondition the output signal prior to the arrival of data input signals; and said means for early driving including power control means for selectively switching between a fully powered condition and a low power condition, whereby ground bounce noise is significantly reduced and the propagation delay is substantially eliminated.

14. An output buffer circuit as claimed in claim 13, wherein said pull-up transistor is a P-channel MOS transistor.

15. An output buffer circuit as claimed in claim 14, wherein said pull-down transistor is an N-channel MOS transistor.

16. An output buffer circuit as claimed in claim 15, wherein said means for early driving includes precondition signals which are generated earlier than said data input signals.

17. An output buffer circuit as claimed in claim 16, wherein said precondition signals are generated approximately 3 to 4 nanoseconds earlier than said data input signals.

18. An output buffer circuit as claimed in claim 13, further comprising enabling means responsive to enable signals and connected to the gates of said P-channel and N-channel transistors for selectively switching the output buffer circuit between an active or low impedance state and an inactive or high impedance state.

19. An output buffer circuit as claimed in claim 13, further comprising retention circuit means responsive to said precondition signals and connected to the gates of said P-channel and N-channel transistors for preventing the logic level on said output node of said output buffer stage from crossing over to an opposite state.

* * * * *